(12) United States Patent
Necoechea et al.

(10) Patent No.: US 6,560,756 B1
(45) Date of Patent: May 6, 2003

(54) METHOD AND APPARATUS FOR DISTRIBUTED TEST PATTERN DECOMPRESSION

(75) Inventors: R. Warren Necoechea, Fremont, CA (US); Mark Deome, San Jose, CA (US); Dave Hollinbeck, San Jose, CA (US)

(73) Assignee: LTX Corporation, Westwood, MA (US)

( * ) Notice: Subject to any disclaimer, the term of this patent is extended or adjusted under 35 U.S.C. 154(b) by 0 days.

(21) Appl. No.: 09/898,160

(22) Filed: Jul. 2, 2001

(51) Int. Cl.$^7$ ................................................ G06F 17/50
(52) U.S. Cl. ................................................ 716/4; 716/5
(58) Field of Search ................. 716/2, 4, 5, 18; 714/718, 724, 728, 738

(56) References Cited

U.S. PATENT DOCUMENTS

| | | | |
|---|---|---|---|
| 5,166,605 A | * 11/1992 | Daum et al. | 324/754 |
| 5,499,248 A | * 3/1996 | Behrens et al. | 714/718 |
| 5,654,971 A | * 8/1997 | Heitele et al. | 714/724 |
| 5,696,772 A | * 12/1997 | Lesmeister | 324/73.1 |
| 5,737,512 A | * 4/1998 | Proudfoot et al. | 714/32 |
| 5,883,906 A | * 3/1999 | Turnquist et al. | 714/32 |
| 6,028,439 A | * 2/2000 | Arkin et al. | 324/537 |
| 6,060,782 A | * 5/2000 | Ohsono et al. | 257/738 |
| 6,101,622 A | * 8/2000 | Lesmeister | 714/724 |
| 6,226,175 B1 | * 5/2001 | Murayama et al. | 235/145 R |

* cited by examiner

Primary Examiner—Matthew Smith
Assistant Examiner—Paul Dinh
(74) Attorney, Agent, or Firm—Blakely, Sokoloff, Taylor & Zafman LLP

(57) ABSTRACT

A method is described that decompresses at least a section of a first test pattern within a first decompression engine while simultaneously decompressing at least a section of a second test pattern within a second decompression engine. The first test pattern is to be applied to a first device under test (DUT) connection. The second test pattern is to be applied to a second DUT connection.

44 Claims, 5 Drawing Sheets

METHOD AND APPARATUS FOR DISTRIBUTED TEST PATTERN DECOMPRESSION

FIELD OF THE INVENTION

The field of invention relates to the testing of semiconductor chips; and more specifically, to a method and apparatus for distributed test pattern decompression.

BACKGROUND

FIG. 1 relates to a traditional method for downloading test patterns from a storage resource 105 (e.g., a server, a mainframe, a magnetic disk array, a magnetic tape drive, etc.) to a semiconductor chip tester 102. Test patterns, when fully downloaded, are eventually applied to a semiconductor chip which is also referred to as a Device Under Test (DUT). The DUT typically has a plurality of input, output, or input/output connections 101a through 101d (e.g, pins, balls, leads, etc.) that receive applied test signals and/or provide responses to the applied test signals. The tester 102 then observes the response of the semiconductor chip to these applied test signals.

By comparing the observed responses against allowable or expected signals, proper functional operation of the semiconductor chip can be verified. The test controller 107 is a portion of the tester 102 that controls the application of one or more test signals to a semiconductor chip.

Each of the DUT connections 101a through 101d may correspond to a single semiconductor chip input connection, or a group of semiconductor chip input connections, depending upon the architecture of the test controller 107. The test controller also has one or more testing interfaces 130a through 130d (e.g., a flex cable) for sending the test patterns to the semiconductor chip. The test controller 107 may also be designed to observe one or more output signals generated by the semiconductor chip in response to the applied test patterns.

In development and/or manufacturing environments, the digital information used to generate a test signal that is applied to a DUT connection (or the digital information that corresponds to the expected data received from a DUT connection in response to a test signal) is typically stored in storage resource 105. The information described just above, may be referred to as test pattern data.

Test pattern data may take various forms. For example, in one embodiment, the digital information is a "test vector" that corresponds to the digital information to be received by a DUT connection during test. In a related embodiment, the digital information is a "response vector" that corresponds to the expected data to be transmitted by a DUT connection during test. Typically, although not a strict requirement, the test pattern data (which may also be referred to a test pattern, test pattern information, and the like), is organized at the DUT connection level. That is, a discrete test pattern is identified as corresponding to a particular DUT connection on a semiconductor chip.

Because a large amount of test pattern data may be used to test a semiconductor chip, the test pattern data is typically stored in a compressed format within the storage resource 105. The compressed test patterns are typically sent from the storage resource 105 to a central processing unit (CPU) 103 (typically over a network 104 such as a local area network (LAN)).

The CPU 103 is communicatively coupled to the tester 102 (e.g., via an industry standard interface (e.g., a PCI bus) or a proprietary interface) or designed as an integral part of the tester 102. The CPU 103 typically comprises a processor that runs software and may be implemented by various means such as a personal computer or workstation that stands outside the tester 102. In other instances the CPU 103 may be implemented on a "motherboard" (e.g., having one or more processor chips) that resides within the same mechanical package as the tester 102.

The CPU 103 may be designed to take on various responsibilities such as: 1) acting as a gateway between the network 104 and the tester 102; 2) performing the aforementioned comparison of observed test signals (that are responsive to the applied test patterns) against their expected or allowable values to assess proper/improper functionality of the semiconductor chip; and/or 3) performing the needed decompression on the test pattern data that is received from the network 104 before it is stored into memory 108.

That is, after compressed test pattern data is received from the network 104 at the CPU 103, the CPU decompresses this data before it is forwarded to the tester 102 and stored in memory 108. A decompression algorithm performed by the CPU 103 effectively extracts the test pattern data to its original form (i.e., as it existed prior to being compressed for storage into storage resource 105). The decompression algorithm may be executed: 1) via a software program that is executed by the processor(s) within the CPU 103; and/or 2) within one or more separate semiconductor chips designed to perform the decompression algorithm in logic. The term decompression engine 106 may be used to refer to these approaches as well as others should they exist.

The tester 102, in various embodiments, may often be viewed as having a parallel arrangement of test controllers and memory devices. That is, the basic test controller 107 and memory 108 architecture may be viewed as being repeated so that a sufficient number of testing interfaces 130a through 130d are created to properly test the semiconductor chip. In order to partially expand the number of DUT testing interfaces, multiple test controllers may be controlled/monitored and/or accessed through a single point of reference such as controller 111 and its corresponding interfaces 112a, 112b, etc.

A plurality of such reference points may be coupled to a central bus 110 to fully expand the number or testing interfaces offered by the tester 102. A CPU interface 109 may also be coupled to the central bus 110 to enable the sending of decompressed test data patterns through the tester 102 and into their proper memory locations. Once the decompressed data patterns are stored in their proper memory unit (such as memory unit 108 for test patterns used with DUT connections 101a through 101d), the test controller 107 that is coupled to the memory unit 108 extracts the decompressed data patterns and applies them to the appropriate DUT connections 101a through 101d in accordance with the overall testing scheme designed for the semiconductor chip being tested.

As semiconductor chip manufacturing techniques continue to advance, however, semiconductor chips are becoming more and more sophisticated. For example, over time, the number of DUT connections on a typical semiconductor chip as well as the performance level of a typical semiconductor chip has continued to expand. With the continued increase in DUT connections and functional performance, the ability to test a semiconductor chip becomes increasingly difficult.

Specifically, with the increase in functional performance, more lengthy and sophisticated test signals are applied or observed at a semiconductor chip's DUT connections. Furthermore, as the number of discrete DUT connections are increasing, the number of test pattern files to be applied to a semiconductor chip are increasing in response. The result of these trends is that the total amount of test pattern data to be applied to a particular semiconductor chip during testing is growing at a rapid rate.

That is, for example, the amount of the storage 105 space that is consumed by a chip's test patterns is expanding at a high rate. As a result, the traditional test pattern loading sequence described just above has become too time consuming. For example, currently, it may take as long as 2 hours for all of a semiconductor chip's test pattern data to be decompressed and loaded from storage space 105 into its proper memory device locations.

BRIEF DESCRIPTION OF THE DRAWINGS

The present invention is illustrated by way of example, and not limitation, in the Figures of the accompanying drawings in which.

DETAILED DESCRIPTION

Test pattern download time can be reduced by implementing a distributed rather than centralized decompression approach. That is, referring to FIG. 1, the prior art decompression strategy discussed above may be viewed as centralized because all of the test pattern decompression is performed (by the decompression engine 106) within a centralized location such as the CPU 103. As a result, test pattern decompression is "serialized" such that two different test patterns cannot be decompressed at the same time.

Figure 2:
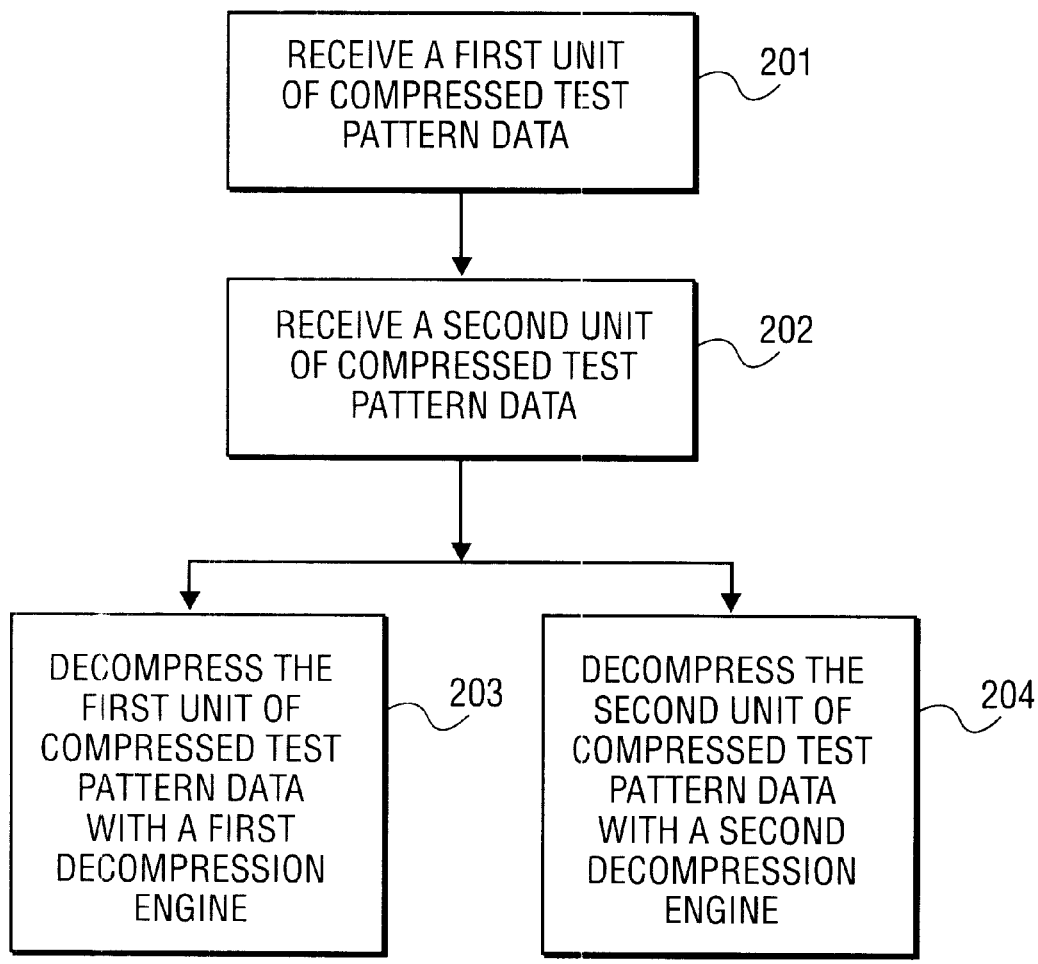
FIG. 2 shows an embodiment of a methodology for the simultaneous decompression of semiconductor chip test pattern data.

By distributing the tester's decompression responsibility to a plurality of decompression engines, decompression may be performed in parallel (rather than in series) which reduces the overall test pattern decompression time. FIG. 2 shows an exemplary methodology 200. In the methodology of FIG. 2, a first unit of compressed test pattern data and a second unit of compressed test pattern data are received 201, 202 by a tester (e.g., from a network).

Then, because the tester has at least two decompression engines, the first unit of compressed test pattern data is decompressed 203 simultaneously with the decompression 204 of the second unit of compressed test pattern data. Because the decompression 203, 204 of two different units of compressed data occurs simultaneously, the amount of time consumed decompressing the total test pattern data for an entire semiconductor chip is reduced. A unit of compressed test pattern data (which may also be referred to as a compressed test pattern data unit) is any part of a compressed test pattern (including an entire test pattern in a compressed format or a section of an entire test pattern in a compressed format). Note that, as discussed, from the viewpoint of testing an entire semiconductor chip, test patterns may be characterized (and/or organized) according to which particular DUT connection they are dedicated to.

That is, for example, a first test pattern may be said to apply to a first DUT connection while a second test pattern may be said to apply a second DUT connection. In one embodiment (which is discussed in more detail below), a unit of compressed test pattern data corresponds to a compressed "section" of a test pattern. That is, a test pattern used to generate a test signal may be viewed as being broken into sections such that the combination of decompressed sections for a particular test pattern, when put together, correspond to the complete test pattern whose signals are applied to its corresponding DUT connection. Similarly, a test pattern unit that corresponds to the expected data received from a DUT connection in response to a test signal may be viewed as being broken into sections such that the combination of decompressed sections for a particular test pattern, when put together, correspond to the complete test pattern for which corresponding signals are expected to be received from its corresponding DUT connection.

Compressed sections of test patterns are sent to the tester and the tester's plurality of decompression engines allow for the simultaneous decompression of these sections. As discussed above, the simultaneous decompression of the individual compressed sections reduces the total amount of overall decompression time as compared to those approaches within the prior art. In order to form the complete decompressed test pattern, decompressed sections belonging to the same test pattern may be combined together (e.g., within a memory).

Figure 3:
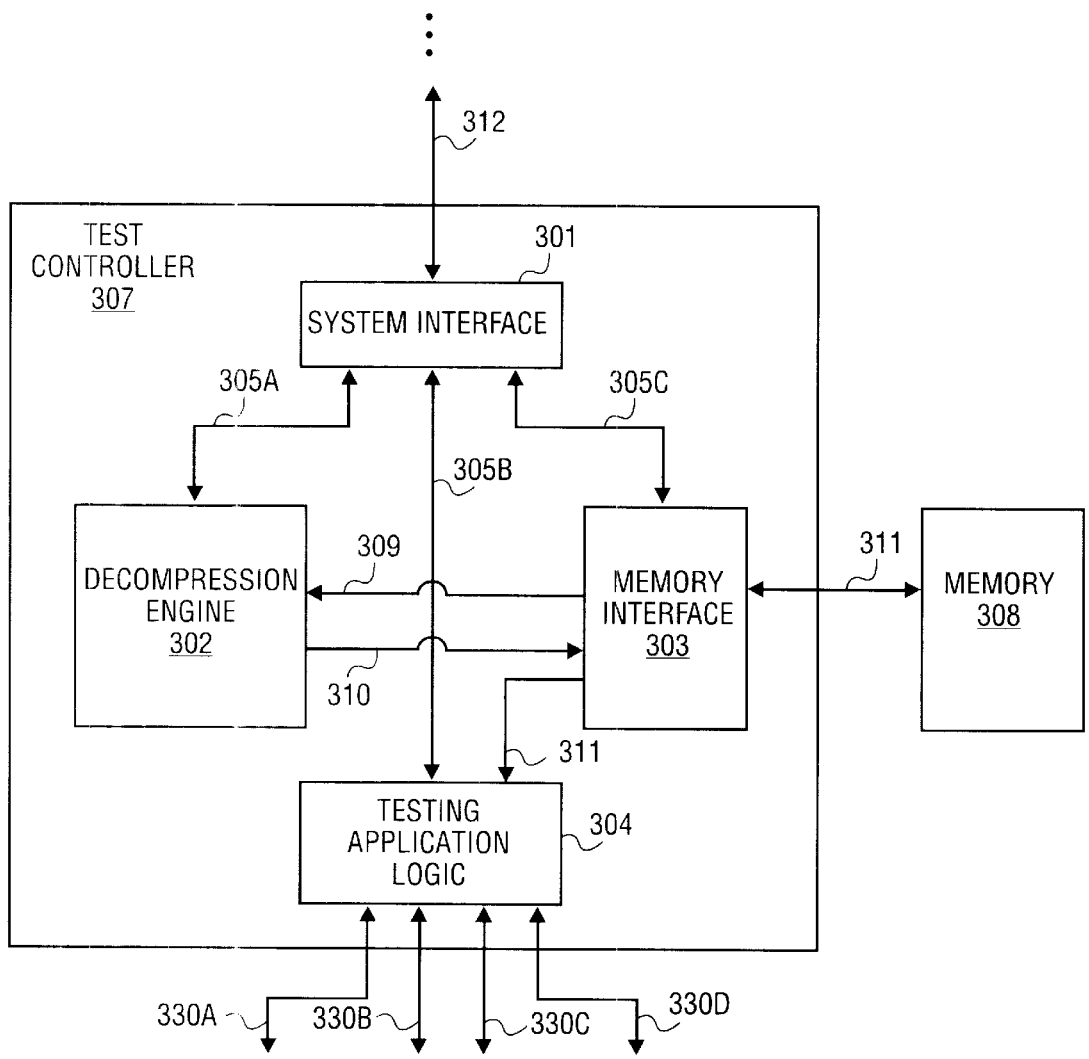
FIG. 3 shows an embodiment of a test controller that may be integrated within a semiconductor chip tester to help implement the methodology of FIG. 2.

The complete decompressed test pattern may then be applied to its particular DUT connection. Depending on the architecture of the tester, simultaneous decompression activity may be performed upon units of compressed test pattern data that belong to the same test pattern or to different test patterns. FIG. 3 shows an embodiment of a test controller that may be easily used to apply to the later of these two approaches.

FIG. 3 shows an embodiment of test controller 307 that corresponds to a tester architecture having a "per X DUT connection" distribution of decompression engines. That is, X corresponds to some number of DUT connections for which there is one decompression engine. In the particular embodiment of FIG. 3, X=4 as there is one decompression engine 302 for four testing interfaces 330*a* through 330*d*. Note that, referring to FIGS. 1 and 3, the test controller 307 of FIG. 3 may correspond to a new test controller that is used in place of test controller 107 of FIG. 1.

Figure 1:
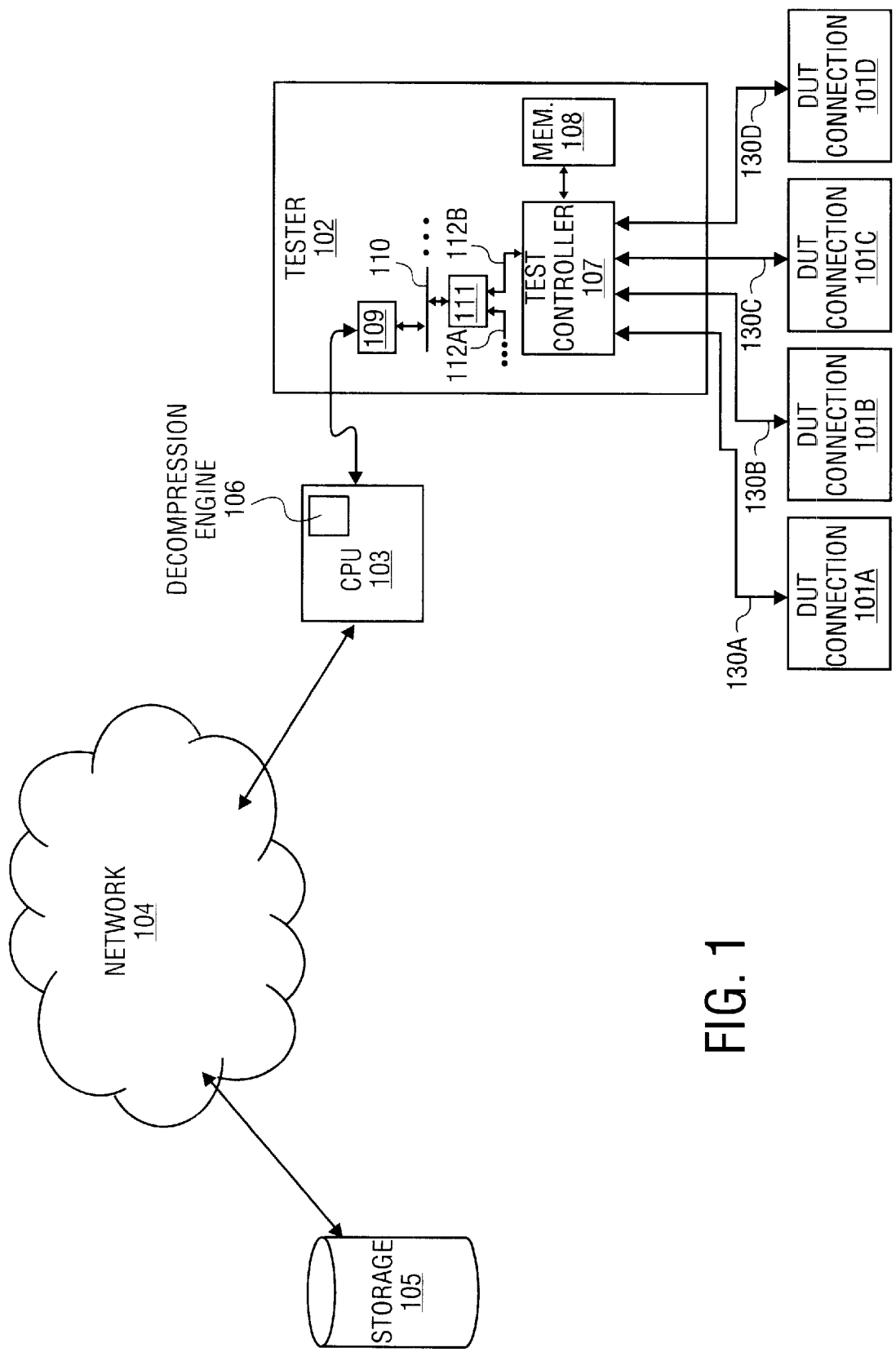
FIG. 1 shows a semiconductor chip tester and a storage resource that are coupled through a network.

The centralized decompression engine 106 approach if FIG. 1, however, results in the tester's test controllers (e.g., of which test controller 107 is just one) being devoid of any decompression functionality. That is, test controller 107 only deals with uncompressed data structures. By contrast, in one embodiment, test controller 307 is designed to manage the decompression responsibilities for testing interfaces 330*a* through 330*d* (which may be viewed as corresponding to testing interfaces 130*a* through 130*d* of FIG. 3.

As such, unlike the prior art, the decompression strategy has been distributed to a "per X DUT connection" level in which the test controller 307 not only applies/receives test signals to/from specific DUT connections but also decompresses their corresponding test patterns as well. The following is a discussion of the various elements of the exemplary test controller 307 of FIG. 3. As seen in FIG. 3, the test controller 307 includes a decompression engine 302, a testing application logic unit 304, a memory interface 303 and a system interface 301.

The testing application logic 304 includes logic that controls the application the decompressed test patterns so that their corresponding test signals can be applied to the DUT connection(s) (not shown in FIG. 3 for simplicity) that are coupled to testing interfaces 330a through 330d. As discussed, the testing interfaces 330a through 330d may correspond (in combination or individually) to a flex cable or other wiring technique that allows for the propagation of test signals from/to the test controller 307 to/from the individual DUT connections that the test controller 307 is responsible for.

The testing application logic 304 may also collect output signals generated by the semiconductor chip (at the individual DUT connections that the test controller is responsible for) in response to the applied test data patterns. In an embodiment, the collected output signals (or the data they represent, or an indication of a comparison made of the collected output signals against a vector of expected values) are directed to the system interface of over communication line 305b. From the system interface 301, the information is then sent over communication line 312.

Communication line 312 may be viewed, in one embodiment, as corresponding to communication line 112b of FIG. 1. That is, communication line 312 serves as a communication platform that enables the communication of control information and or test data to/from the test controller 307 from/to higher levels in the system (such as a CPU unit that controls, from a high level, the testing of the DUT). Communication line 312 may be implemented, for example, with any proprietary or industry standard serial or parallel communication interface.

System interface 301 acts as a hub between the information sent to/from communication line 312 from/to the other functional units 302, 303, 304 within the test controller. As such, the system interface 301 is communicatively coupled to each of these units 302, 303, 304 by communication lines 305a,b,c respectively. Note that communication lines 305a, b,c may also be implemented, for example, with any proprietary or industry standard serial or parallel communication interface.

In an embodiment, the system interface 301: 1) routes control information (e.g., commands, requests, responses, etc.) that is sent from the higher levels of the tester (along communication line 312) to the other functional units 302, 303, 304 within the test controller 307; and 2) routes control information (e.g., commands, requests, responses, etc.) that is sent from the other functional units 302, 303, 304 within the test controller 307 to higher levels of the tester (along communication line 312).

In an embodiment, the system interface 301 also sends compressed test pattern units that are received from the higher levels of the tester (along communication line 312) to the memory interface unit 303. The memory interface 303 then stores the compressed test pattern units into a memory device 308 (or a bank of memory devices 308). The memory interface 303 includes logic that provides the proper signaling for reading/writing data from/to the memory 308.

The decompression engine 302 is coupled to the memory interface 303 via communication lines 309, 310. The decompression engine 302 can be implemented, as just one embodiment, as one or more processors (e.g., embedded or non-embedded) that execute a decompression algorithm software routine. As another exemplary embodiment, the decompression engine 302 may be implemented as a logic circuit designed to execute a decompression algorithm. Alternatively, dedicated logic and software routines may be combined together (e.g., in an embedded, processor approach) to form the decompression engine.

Various types of decompression algorithms may be used to decompress the compressed test pattern data units. Examples include GZIP, proprietary decompression algorithms as well as others not listed above. The decompression engine 302 decompresses the compressed test pattern data units that correspond to at least part of those test patterns that, when decompressed, will be applied to at least one of the testing interfaces 330a through 330d managed by testing application logic 304.

Note that in the particular embodiment of FIG. 3, the testing for as many as four testing interfaces 330a through 330d are managed by the testing application logic 304. As such, in the particular example of FIG. 3, the decompression engine 302 can decompress data sufficient for the testing of as many as four testing interfaces 330a through 330d. It is important to note, however, that the number of testing interfaces per decompression engine 302 may vary from embodiment to embodiment (e.g., some embodiments may have more than four testing interfaces per decompression engine while others may have less than four testing interfaces per decompression engine).

In an embodiment, one DUT connection is coupled to each testing interface 330a through 330d. As such, consistent with the description provided above, the decompression engine 302 is responsible for the decompression activity needed to supply test signals for up to four DUT connections. Note that, again, ratios of the number of DUT connections per decompression engine other than four are also possible.

As discussed, after the system interface 301 receives a compressed test pattern data unit from communication line 312, the compressed test pattern data unit is sent to the memory interface 303. The memory interface 303 stores the compressed test pattern data unit into memory 308. Eventually, the compressed test pattern data unit is read from the memory 308 by the memory interface 303 which then directs the data pattern data unit to the decompression engine 302 along communication line 309.

The decompression engine 302 then decompresses the compressed test pattern data unit and sends a decompressed test pattern data unit to the memory interface unit 303 along communication line 310. The decompressed test pattern data unit is then stored into the memory 308 by the memory interface 303. Then, during testing of the semiconductor chip, the decompressed test pattern data unit is read from the memory 308 (e.g., along with a complete test pattern to be applied to a particular DUT connection that the decompressed test pattern data unit is a section of) and directed to the testing application logic 304 along communication line 311. The testing application logic 304 then applies the decompressed test pattern data unit in a manner that is consistent with the testing of a semiconductor chip.

For example, if the decompressed test pattern data unit corresponds to input test signal stimuli, the input test signal will be directed along an appropriate testing interface to its corresponding DUT connection. Alternatively, for example, if the decompressed test pattern corresponds to expected output responses from a DUT connection, the expected output responses may be compared against the information actually received from its corresponding DUT connection. An indication of the results of the comparison may then be forwarded to higher levels in the tester (e.g., by being forwarded though system interface 301).

Figure 4:
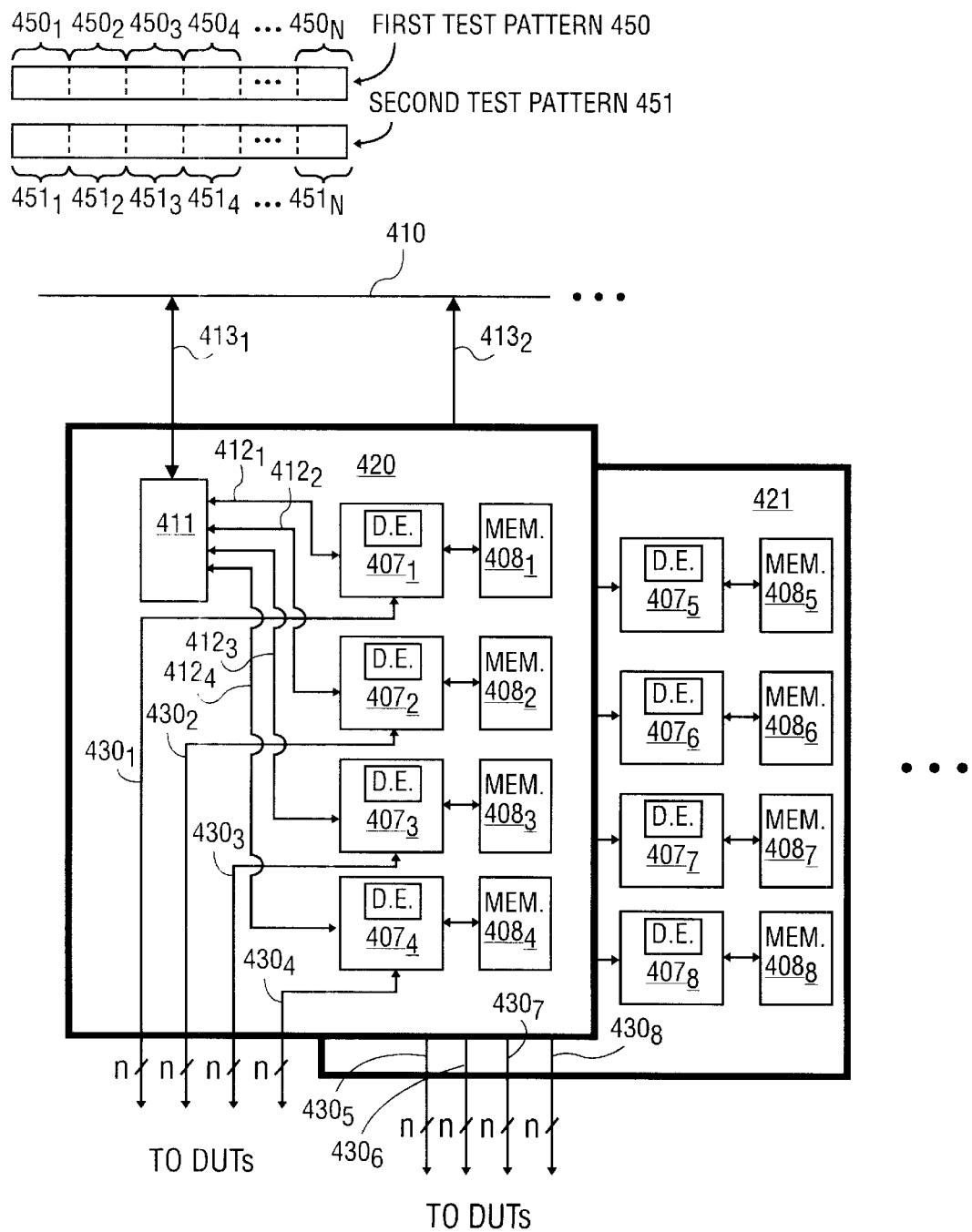
FIG. 4 shows an embodiment of a tester that may incorporate the improved test controller architecture of FIG. 2.

In an embodiment, as discussed above, a unit of compressed test pattern data corresponds to a compressed "section" of a test pattern. That is, for example, each test pattern may be viewed as being broken into sections such that the combination of decompressed sections for a particular test pattern, when put together, correspond to the complete test pattern that is applied to its corresponding DUT connection. FIG. 4 shows an embodiment of a tester where each test pattern data unit may be designed to correspond to a section of a test pattern.

In the embodiment of FIG. 4, a plurality of test controllers $407_1$ through $407_8$, are each respectively coupled to a memory $408_1$ through $408_8$. Each of the test controllers $407_1$ through $407_8$ of FIG. 4 may correspond to the test controller 307 embodiment discussed above with respect to FIG. 3. As just one exemplary embodiment, as seen in FIG. 4, a subset of test controllers may be designed onto a common planar board that plugs into the tester.

That is, each of test controllers $407_1$ through $407_4$ are mounted on planar board 420, while each of test controllers $407_5$ through $407_8$ are mounted on planar board 421. If each test controller $407_1$ through $407_8$ provides four testing interfaces (as in the case of the exemplary test controller 307 embodiment of FIG. 3), each planar board 420, 421 provides sixteen test interfaces (e.g., n=4 in FIG. 4).

Additional planar boards may be plugged into the tester to further expand the number of test interfaces. Note also that in the embodiment of FIG. 4, the planar boards 420, 421 are communicatively coupled to a central system bus 410 through a test interface controller (e.g., test interface controller 411 on planar board 420). Time savings with respect to test pattern download time may be realized by taking advantage of the parallel architecture of the tester and the presence of a decompression engine within each test controller $407_1$ through $407_8$.

In an embodiment, compressed sections for each of the test patterns to be used during the testing of the semiconductor chip are stored into their corresponding memory locations. Then, each of the sections are decompressed in parallel such that compressed test pattern data for two different test patterns are simultaneously decompressed. As discussed, the simultaneous decompression activity conserves decompression time.

As an example, a first compressed section $450_1$ of a first test pattern 450 may be stored into its corresponding memory location (e.g., within memory $408_1$) while a first compressed section $451_2$ of a second test pattern 451 may be stored into its corresponding memory location (e.g., within memory $408_2$). The first compressed sections for other test patterns may also be stored into their corresponding memories (e.g., throughout the tester such as within each memory units $408_3$ through $408_8$, etc.).

Then, in a large parallel operation, each of these compressed first sections can be decompressed simultaneously. That is, the first compressed section $450_1$ of data pattern 450 is decompressed by the decompression unit within test controller $307_1$ while, simultaneously, the first compressed section $451_1$ of data pattern 451 is decompressed by the decompression unit within test controller $407_2$. The compressed sections $450_1$ and $451_1$ may also be simultaneously read from their respective memories $408_1$, $408_2$. After decompression, the corresponding decompressed first sections of test patterns 450, 451 may be simultaneously written back into their corresponding memories $408_1$, $408_2$.

Note that, as discussed, the decompression engine within each test controller $407_1$ through $407_8$, etc. may be designed to decompressed test data for up to n (e.g., n=4) testing interfaces $430_1$ through $430_8$. As such, compressed test data units for other test patterns may be included with the simultaneous decompression mentioned just above. Specifically, for an example where n=4, first compressed sections of a third, fourth and fifth test patterns may be performed along with the decompression of the first compressed section $450_1$ of data pattern 450.

Similarly, first compressed sections of a sixth, seventh and eighth test patterns may be performed along with the decompression of the first compressed section $450_1$ of data pattern 450. Note that both the compressed and decompressed versions of the first sections of the third, fourth and fifth data patterns may also be stored in memory unit $408_1$. Similarly, the compressed and decompressed versions of the first sections of the sixth, seventh and eighth data patterns may also be stored in memory unit $408_2$.

In an embodiment, after the first sections of each of the test patterns to be applied by the tester are decompressed and stored back into their memory locations, the process repeats for the second compressed section for each of these test patterns. That is, the second compressed section for each of these test patterns (e.g., section $450_2$ for data pattern 450, section $451_2$ for data pattern 451, etc.) is stored into its corresponding memory units, read from its corresponding memory unit, decompressed, and stored back into its corresponding memory unit in a decompressed format.

Eventually, all the sections for all the test patterns are decompressed. The individual decompressed sections for a common test pattern may be combined in their memory to effectively construct a complete decompressed test pattern. Each test controller $407_1$ through $407_8$, etc. may be designed to control or otherwise manage the organization of its corresponding memory $407_1$ through $407_8$, etc. so that the boundaries between neighboring sections are identified during decompression and the complete test pattern can be constructed from the decompressed sections.

Figure 5:
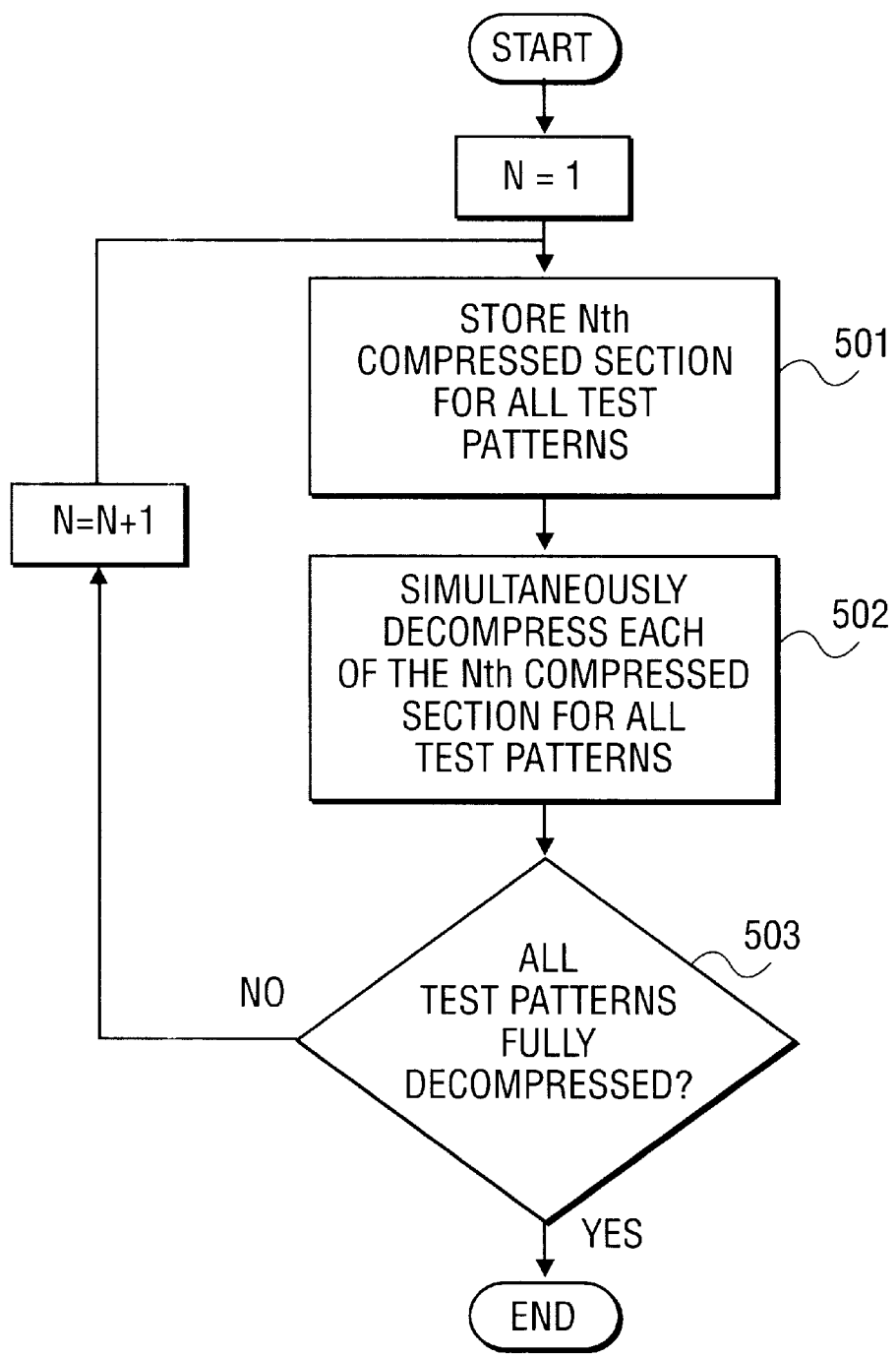
FIG. 5 shows an embodiment of a methodology that may be utilized by the tester of FIG. 4 to implement the simultaneous decompression of the tester's test patterns.

FIG. 5 summarizes the methodology described above. Starting with the first compressed section of each test pattern to be applied by the tester, each of these compressed sections are stored 501 in their respective memory location. Then, each of these sections are simultaneously decompressed 502. The process then iterates (e.g., the second-compressed section for each test pattern are stored 501 in their respective memory and simultaneously decompressed 502, etc.) until all the sections for all of the test patterns have been decompressed (which corresponds to all the test patterns being decompressed 503).

Referring back to FIG. 3, it is important to note that, depending on the sophistication of the test controllers $307_1$ through $307_8$, etc., that the "next" sections may be downloaded into their corresponding memories while the "current" sections are being decompressed. That is, for example, the second sections may be downloaded into their corresponding memories while the first sections are being decompressed. On a broader scale, it is also important to note that other parallel decompression schemes are possible besides those specifically recited above.

Note that a test controller having a decompression engine may be implemented as one or more semiconductor chips. Note, however, that a test controller having a decompression engine may also be implemented within machine readable media. For example, circuit designs that implement the test controller embodiment 307 of FIG. 3 may be stored upon and/or embedded within machine readable media associated with a design tool used for designing semiconductor devices.

Examples include a netlist formatted in the VHSIC Hardware Description Language (VHDL) language or Verilog language. Some netlist examples include: a behavioral level netlist, a register transfer level (RTL) netlist, a gate level netlist and a transistor level netlist. Machine readable media also include media having layout information such as a GDS-II file. Furthermore, netlist files or other machine readable media for semiconductor chip design may be used in a simulation environment to perform the methods of the teachings described above.

Thus, it is also to be understood that embodiments of this invention may be used as or to support a software program executed upon some form of processing core (such as the CPU of a computer) or otherwise implemented or realized upon or within a machine readable medium. A machine readable medium includes any mechanism for storing or transmitting information in a form readable by a machine (e.g., a computer). For example, a machine readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method, comprising:
   a) writing into a first memory at least a section of a first test pattern and writing into a second memory at least a section of a second test pattern, said at least a section of a first test pattern within a compressed format and said at least a section of a second test pattern within a compressed format;
   b) decompressing said at least a section of a first test pattern within a first decompression engine while simultaneously decompressing said at least a section of a second test pattern within a second decompression engine;
   c) writing into said first memory said at least a section of a first test pattern and writing into said second memory said at least a section of a second test pattern, said at least a section of a first test pattern within a decompressed format as a consequence of said decompressing and said at least a section of a second test pattern within a decompressed format as a consequence of said decompressing; and
   d) applying said first test pattern relative to a first device under test (DUT) connection and applying said second test pattern relative to a second DUT connection.

2. The method of claim 1 further comprising, prior to said decompressing but after said writing of said compressed at least a section of said first and second test patterns, reading from said first memory said at least a section of a first test pattern and reading from said second memory said at least a section of a second test pattern, said at least a section of a first test pattern and said at least a section of a second test pattern each being within a compressed format during said reading.

3. The method of claim 2 wherein said reading from said first memory and said reading from said second memory occurs simultaneously.

4. The method of claim 1 further comprising reading from said first memory, prior to said applying but after said decompressing, said first test pattern, said first test pattern within a decompressed format during said reading.

5. The method of claim 4 wherein said first test pattern corresponds to data to be driven to said first DUT connection.

6. The method of claim 4 wherein said first test pattern corresponds to data to be observed from said first DUT connection.

7. The method of claim 4 further comprising reading from said second memory, prior to said applying but after said decompressing, said second test pattern, said second test pattern within a decompressed format during said reading.

8. The method of claim 7 wherein said second test pattern corresponds to data to be driven to said first DUT connection.

9. The method of claim 7 wherein said second test pattern corresponds to data to be observed from said first DUT connection.

10. An apparatus, comprising:
    a) first means for writing into a first memory at least a section of a first test pattern and second means for writing into a second memory at least a section of a second test pattern, said at least a section of a first test pattern within a compressed format and said at least a section of a second test pattern within a compressed format;
    b) third means for decompressing said at least a section of a first test pattern and fourth means for simultaneously decompressing said at least a section of a second test pattern, said first means also for writing into said first memory said at least a section of a first test pattern and said second means also for writing into said second memory said at least a section of a second test pattern, said at least a section of a first test pattern within a decompressed format as a consequence of said decompressing and said at least a section of a second test pattern within a decompressed format as a consequence of said decompressing; and
    c) fourth means for applying said first test pattern relative to a first device under test (DUT) connection and fifth means for applying said second test pattern relative to a second DUT connection.

11. The apparatus of claim 10 wherein said first means further comprises means for, prior to said decompressing but after said writing of said compressed at least a section of said first and second test patterns, reading from said first memory said at least a section of a first test pattern and wherein said second means further comprises means for, prior to said decompressing but after said writing of said compressed at least a section of said first and second test patterns, reading from said second memory said at least a section of a second test pattern.

12. The apparatus of claim 11 wherein said first and second means are designed so that said reading from said first memory and said reading from said second memory occurs simultaneously.

13. The apparatus of claim 10 wherein said first means further comprises means for reading from said first memory, prior to said applying but after said decompressing, said first test pattern, said first test pattern within a decompressed format during said reading.

14. The apparatus of claim 13 wherein said first test pattern corresponds to data to be driven to said first DUT connection.

15. The apparatus of claim 13 wherein said first test pattern corresponds to data to be observed from said first DUT connection.

16. The method of claim 13 wherein said second means further comprises means for reading from said second memory, prior to said applying but after said decompressing, said second test pattern, said second test pattern within a decompressed format during said reading.

17. The method of claim 16 wherein said second test pattern corresponds to data to be driven to said first DUT connection.

18. The method of claim 17 wherein said second test pattern corresponds to data to be observed from said first DUT connection.

19. An apparatus, comprising:
semiconductor chip tester that simultaneously decompresses a same section for each of a plurality of test patterns, said semiconductor chip tester designed to read each of said sections from each of said sections' respective memories prior to said decompression, said semiconductor chip tester designed to write uncompressed versions of each of said sections back into said sections' respective memories after said decompression.

20. The apparatus of claim 19 wherein said semiconductor chip tester further comprises a plurality of Device Under Test (DUT) controllers that are distributed within said tester so that whatever testing that is carried out at different sets of DUT connections can be separately controlled.

21. The apparatus of claim 20 wherein each DUT controller further comprises its own decompression engine in order to help perform said decompression.

22. The apparatus of claim 21 wherein each DUT controller is coupled to one of said respective memories.

23. The apparatus of claim 22 wherein each DUT controller further comprises its own system interface for receiving one of said sections prior to said section being stored in its respective memory.

24. The apparatus of claim 17 wherein said tester is further designed to simultaneously read each of said sections from each of said sections' respective memories prior to said decompression.

25. The apparatus of claim 17 wherein said tester is further designed to simultaneously write uncompressed versions of each of said sections back into said sections' respective memories after said decompression.

26. A method comprising:
a) writing, within different memories, compressed versions of the same relative section for each of a plurality of different Device Under Test (DUT) connections;
b) reading, from said memories, said compressed versions of the same relative section for each of a plurality of different test patterns;
c) decompressing each of said sections with different decompression engines to form decompressed versions of the same relative section for each of a plurality of different test patterns; and
d) writing, back into their respective memories, said decompressed versions of the same relative section for each of a plurality of different DUT connections.

27. The method of claim 26 further comprising receiving, at different Device Under Test (DUT) controllers, a different one of said compressed versions of the same section for each of a plurality of different test patterns, said receiving happening prior to said writing within different memories.

28. The method of claim 26 wherein said reading further comprises simultaneously reading, from said memories, said compressed versions of the same section for each of a plurality of different DUT connections.

29. The method of claim 26 wherein said decompressing further comprises simultaneously decompressing each of said sections with different decompression engines to form decompressed versions of the same section for each of a plurality of different DUT connections.

30. The method of claim 26 wherein said writing, back into their respective memories, further comprises simultaneously writing, back into their respective memories, said decompressed versions of the same relative section for each of a plurality of different DUT connections.

31. The method of claim 26 further comprising reading each of said decompressed versions from their respective memories and carrying out testing at different DUT connections of a semiconductor chip.

32. The method of claim 31 wherein at least one of said different DUT connections further comprises a ball.

33. The method of claim 31 wherein at least one of said different DUT connections further comprises a lead.

34. The method of claim 31 wherein at least one of said different DUT connections further comprises a pin.

35. A semiconductor chip tester, comprising:
a) a first Device Under Test (DUT) controller coupled to a first memory, said first DUT controller further comprising:
1) an interface to said first memory and
2) a first decompression engine, said interface to said first memory being communicatively coupled with said first decompression engine so that:
a) said interface to said first memory can send toward said first decompression engine a compressed section of a first test pattern after said interface to first memory has read said compressed section of a first test pattern from said first memory and
b) said first decompression engine can send toward said first memory interface a decompressed version of said section of a first test pattern after said first decompression engine has decompressed said compressed section of a first test pattern; and
b) a second DUT controller coupled to a second memory, said second DUT controller further comprising:
1) an interface to said second memory and
2) a second decompression engine, said interface to said second memory being communicatively coupled with said second decompression engine so that:
a) said interface to said second memory can send toward said second decompression engine a compressed section of a second test pattern after said interface to second memory has read said compressed section of a second test pattern from said second memory and
b) said second decompression engine can send toward said second memory interface a decompressed version of said section of a second test pattern after said second decompression engine has decompressed said compressed section of a second test pattern.

36. The semiconductor chip tester of claim 35 wherein said tester is designed to decompress said section of said first test pattern while said section of said second test pattern is also being decompressed.

37. The semiconductor chip tester of claim 36 wherein said section of said first test pattern is the same section relative to said first test pattern as said section of said second test pattern is relative to said second test pattern.

38. The semiconductor chip tester of claim 35 wherein said first DUT controller and said second DUT controller are integrated onto the same planar board.

39. The semiconductor chip tester of claim 35 wherein said first DUT controller further comprises a system interface that, prior to said interface to said first memory having read said compressed section of a first test pattern, receives said compressed section of a first test pattern and forwards said compressed section of a first test pattern to said interface to said first memory so that said compressed section of a first test pattern can be written into said first memory.

40. The semiconductor chip tester of claim 39 wherein said second DUT controller further comprises a system interface that, prior to said interface to said second memory having read said compressed section of a second test pattern, receives said compressed section of a second test pattern and forwards said compressed section of a second test pattern to said interface to said second memory so that said compressed section of a second test pattern can be written into said second memory.

41. The semiconductor chip tester of claim 35 wherein said interface to said first memory is also designed to write said decompressed version of said section of a first test pattern into said first memory after it is received from said first decompression engine.

42. The semiconductor chip tester of claim 41 wherein said interface to said first memory is also designed to read said decompressed version of said section of a first test pattern from said first memory so that it can be used to test a first DUT connection.

43. The semiconductor chip tester of claim 42 wherein said interface to said second memory is also designed to write said decompressed version of said section of a second test pattern into said second memory after it is received from said second decompression engine.

44. The semiconductor chip tester of claim 43 wherein said interface to said second memory is also designed to read said decompressed version of said section of a second test pattern from said second memory so that it can be used to test a second DUT connection.

* * * * *